US012235585B2

United States Patent
Heijmans et al.

(10) Patent No.: US 12,235,585 B2
(45) Date of Patent: Feb. 25, 2025

(54) RADIATION CONDUIT

(71) Applicant: ASML Netherlands B.V., Veldhoven (NL)

(72) Inventors: Remco Johannes Elisa Heijmans, Neeritter (NL); Gerrit Van Der Straaten, Oisterwijk (NL); Ivo Vanderhallen, Leende (NL); Jan Steven Christiaan Westerlaken, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 345 days.

(21) Appl. No.: 17/764,865

(22) PCT Filed: Sep. 8, 2020

(86) PCT No.: PCT/EP2020/075034
§ 371 (c)(1),
(2) Date: Mar. 29, 2022

(87) PCT Pub. No.: WO2021/063637
PCT Pub. Date: Apr. 8, 2021

(65) Prior Publication Data
US 2022/0390852 A1    Dec. 8, 2022

(30) Foreign Application Priority Data
Sep. 30, 2019 (EP) .................... 19200480

(51) Int. Cl.
*G03F 7/00*  (2006.01)
*H05G 2/00*  (2006.01)

(52) U.S. Cl.
CPC ...... *G03F 7/70033* (2013.01); *G03F 7/70166* (2013.01); *H05G 2/003* (2013.01)

(58) Field of Classification Search
CPC .. G03F 7/70033; G03F 7/70166; H05G 2/003
See application file for complete search history.

(56) References Cited

U.S. PATENT DOCUMENTS

| 9,795,023 B2 | 10/2017 | Ershov et al. |
| 10,034,362 B2 | 7/2018 | Kuritsyn et al. |
| (Continued) | | |

FOREIGN PATENT DOCUMENTS

| CN | 110169206 A | 8/2019 |
| DE | 102014222674 B3 | 5/2016 |
| (Continued) | | |

OTHER PUBLICATIONS

International Search Report and Written Opinion of the International Searching Authority directed to related International Patent Application No. PCT/EP2020/075034, mailed Dec. 15, 2020, 9 pages.

(Continued)

*Primary Examiner* — Nicole M Ippolito
*Assistant Examiner* — Hanway Chang
(74) *Attorney, Agent, or Firm* — Sterne, Kessler, Goldstein & Fox P.L.L.C.

(57) ABSTRACT

A radiation source for an EUV lithography apparatus is disclosed. The radiation source comprises a chamber comprising a plasma formation region, a radiation collector arranged in the chamber and configured to collect radiation emitted at the plasma formation region and to direct the collected radiation towards an intermediate focus region, and a radiation conduit disposed between the radiation collector and the intermediate focus region. The radiation conduit comprises at least one outlet on an inner surface of a wall of the radiation conduit for directing a protective gas flow, and at least one guide portion extending from the inner surface of the wall of the radiation conduit and configured to (Continued)

redirect the protective gas flow. Also disclosed is a method of reducing debris and/or vapor deposition in the radiation conduit by providing a protective gas flow to the at least one outlet of the radiation conduit.

14 Claims, 5 Drawing Sheets

(56) References Cited

U.S. PATENT DOCUMENTS

| | | |
|---|---|---|
| 2005/0269525 A1 | 12/2005 | Terken et al. |
| 2009/0073396 A1 | 3/2009 | Gabriel Van De Vijver et al. |
| 2013/0001442 A1 | 1/2013 | Schepers et al. |
| 2015/0008335 A1 | 1/2015 | Bykanov et al. |
| 2019/0128317 A1 | 5/2019 | Giannakopoulos |
| 2019/0146350 A1 | 5/2019 | Wahlisch |
| 2020/0185212 A1 | 6/2020 | Ueda et al. |
| 2024/0085796 A1 | 3/2024 | Labetski et al. |

FOREIGN PATENT DOCUMENTS

| | | |
|---|---|---|
| EP | 2533078 A1 | 12/2012 |
| JP | 2010-539700 A | 12/2010 |
| JP | 2018-500601 A | 1/2018 |
| TW | 201907753 A | 2/2019 |
| WO | WO 2014/001071 A2 | 1/2014 |
| WO | WO 2016/071175 A1 | 5/2016 |
| WO | WO 2018/127565 A2 | 7/2018 |

OTHER PUBLICATIONS

International Preliminary Report on Patentability directed to related International Patent Application No. PCT/EP2020/075034, issued Apr. 5, 2022, 7 pages.

Taiwanese Office Action directed to Taiwanese Patent Application No. 109133214, mailed Jun. 5, 2024; 14 pages.

RADIATION CONDUIT

CROSS-REFERENCE TO RELATED APPLICATIONS

This application claims priority of EP application 19200480.2, which was filed on 30 Sep. 2019 and which is incorporated herein its entirety by reference.

FIELD

The present invention relates to a radiation conduit for a radiation source for an EUV lithography apparatus, and a radiation source for an EUV lithography apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles and/or vapor of a suitable material (e.g. tin (Sn)), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Plasma creation within an LLP source may cause contaminative particles and/or vapor and/or particulate debris to be created from the fuel. In some cases, such contaminative particles and/or vapor and/or particulate debris may move either at relatively fast speeds, in which case they tend to generally follow the path of the radiation beam. In other cases, such contaminative particles and/or vapor and/or particulate debris may move at relatively slow speeds, in which case they are free to undergo Brownian motion. In some lithographic apparatus the relatively slow-moving contaminative particles and/or vapor may be conveyed by a flow of gas within the lithographic apparatus.

Both the relatively fast moving and relatively slow-moving contaminative particles and/or vapor may move towards the patterning device of the lithographic apparatus. If the contaminative particles and/or vapor reach the patterning device (even in very small numbers) then they may contaminate the patterning device. The contamination of the patterning device may reduce the imaging performance of the lithographic apparatus and may in serious cases require the patterning device to be replaced, incurring costs and production inefficiencies.

Furthermore, particulate debris and/or vapor may be incident on other components within the radiation source. Such debris and/or vapor may affect the ability of the radiation source to generate an EUV producing plasma or to provide a beam of EUV radiation from the plasma to other components of the lithographic apparatus.

For example, particulate debris and/or vapor may be incident upon and accumulate on components of the radiation source that are designed to absorb unwanted radiation, such as infrared radiation. Such accumulation of particulate debris and/or vapor may impact upon an ability for such components to absorb unwanted radiation.

It is desirable to provide a means to reduce or mitigate the abovementioned effects of contaminative particles and/or vapor and/or particulate debris.

SUMMARY

According to a first aspect of the present invention, there is provided a radiation source for an EUV lithography apparatus, the radiation source comprising: a chamber comprising a plasma formation region; a radiation collector arranged in the chamber and configured to collect radiation emitted at the plasma formation region and to direct the collected radiation towards an intermediate focus region; and a radiation conduit disposed between the radiation collector and the intermediate focus region, wherein the radiation conduit comprises at least one outlet on an inner surface of a wall of the radiation conduit for directing a protective gas flow, and at least one guide portion extending from the inner surface of the wall of the radiation conduit and configured to redirect the protective gas flow.

Advantageously, a radiation source embodying the present invention may exhibit a substantially reduced rate of deposition of particulate debris and/or vapor e.g. Sn debris particles and/or vapor, on the radiation conduit. Furthermore, a radiation source embodying the present invention may result in significantly less particulate debris and/or vapor passing through the intermediate focus and entering the lithographic apparatus. As such, the present invention may also mitigate contamination of the lithographic apparatus by such particulate debris and/or vapor. The outlets may be disposed in the inner surface of the wall of the radiation conduit. The outlets may comprise openings in the inner surface of the wall of the radiation conduit.

The at least one guide portion may be configured to redirect the protective gas flow from a first direction substantially away from the inner surface of the wall of the radiation conduit to a second direction substantially along the inner surface of the wall of the radiation conduit.

The second direction may be substantially towards the plasma formation region.

The at least one guide portion may redirect the protective gas flow to form a protective gas curtain flow directed substantially along the inner surface of the wall of the radiation conduit. Preferably the curtain flow is evenly distributed over the inner surface of the wall of the radiation conduit while particulate debris might end up everywhere at the inner surface.

The inner surface of the wall may taper inwardly from an entrance aperture distal the intermediate focus region to an exit aperture proximal the intermediate focus region. With a radiation source for an EUV lithography apparatus it is important that no particulate debris or at least as few debris as possible escapes through the exit aperture. The debris will negatively affect the lithographic processes in the other parts of the lithography apparatus (sometimes referred to as scanner part). By placing the wall close to the intermediate focus region, the protective gas flow can effectively prevent the particulate debris from escaping through the exit aperture.

The radiation conduit may be disposed proximal the intermediate focus region.

The at least one guide portion and the radiation conduit may be formed as a monolithic structure.

The at least one guide portion may extend circumferentially and/or continuously around the inner surface of the wall of the radiation conduit.

A surface of the at least one guide portion may form a channel between the inner surface of the wall of the radiation conduit and the at least one the guide portion.

The at least one outlet on the inner surface of the wall of the radiation conduit may be disposed in the channel.

The inner surface of the wall of the radiation conduit may be defined by at least one of: a smooth surface; ridged surfaces; a stepped surface; undulating surfaces; and/or vane surfaces.

The channel may be angled relative to the inner surface of the wall such that the protective gas flow is redirected away from a ridge, step, undulation or vane of the radiation conduit.

The radiation conduit may comprise a plurality of guide portions.

The/each guide portion may redirect a protective gas flow from a plurality of outlets. The plurality of outlets may be combined with the at least one guide portion extending circumferentially and/or continuously around the inner surface of the wall of the radiation conduit. This enables to evenly distribute the flow of protective gas along the circumference of the radiation conduit. Further, a surface of the at least one guide portion may form a channel between the inner surface of the wall of the radiation conduit and the at least one the guide portion. This enables to form a ring-shaped channel wherein the protective gas flow can accumulate before flowing along the inner surface of the wall of the radiation conduit. When a plurality of outlets is provided in the inner surface of the wall of the radiation conduit the protective gas flow can evenly accumulate in the channel.

The radiation conduit may comprise at least one outlet on an inner surface of a wall of the radiation conduit for directing a protective gas flow.

The radiation source may comprise magnets for generating a magnetic field within the chamber, the magnets being arranged to, in use, trap charged particles radiating from the plasma.

The radiation conduit may comprise at least one guide portion extending from the inner surface of the wall of the radiation conduit and configured to redirect the protective gas flow.

According to a second aspect of the present invention, there is provided a method of reducing debris and/or vapor deposition in a radiation conduit according to the first aspect, the method comprising providing a protective gas flow to the at least one outlet of the radiation conduit, such that the protective gas flow is redirected by the at least one guide portion.

BRIEF DESCRIPTION OF THE DRAWINGS

Embodiments of the invention will now be described, by way of example only, with reference to the accompanying schematic drawings, in which.

DETAILED DESCRIPTION

Figure 1:
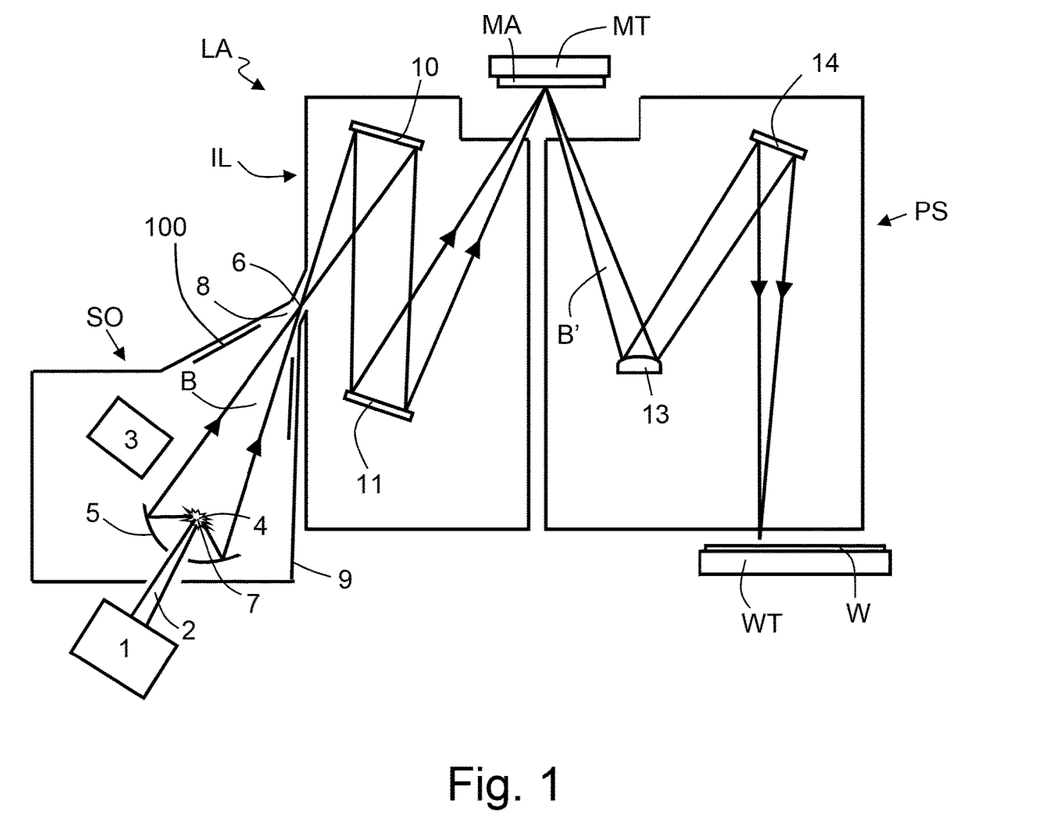
FIG. 1 depicts a lithographic system comprising a lithographic apparatus and a radiation source according to an aspect of the present invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Also shown in FIG. 1 is a radiation conduit 100 according to an embodiment of the invention. The radiation conduit 100 is disposed in the source SO through which the beam B of EUV radiation formed by the collector 5 passes before it reaches the intermediate focus 6. The radiation conduit 100 may be configured to absorb and/or reflect infrared radiation, as described in more detail below.

References to an "inner surface" of a wall of the radiation conduit should be understood to refer to a surface of the wall of the radiation conduit that is inside, or faces into, a conduit, vessel or chamber defined by the wall of the radiation conduit, e.g. a surface of the conduit through which the beam B of EUV radiation formed by the collector 5 passes.

Figure 2:
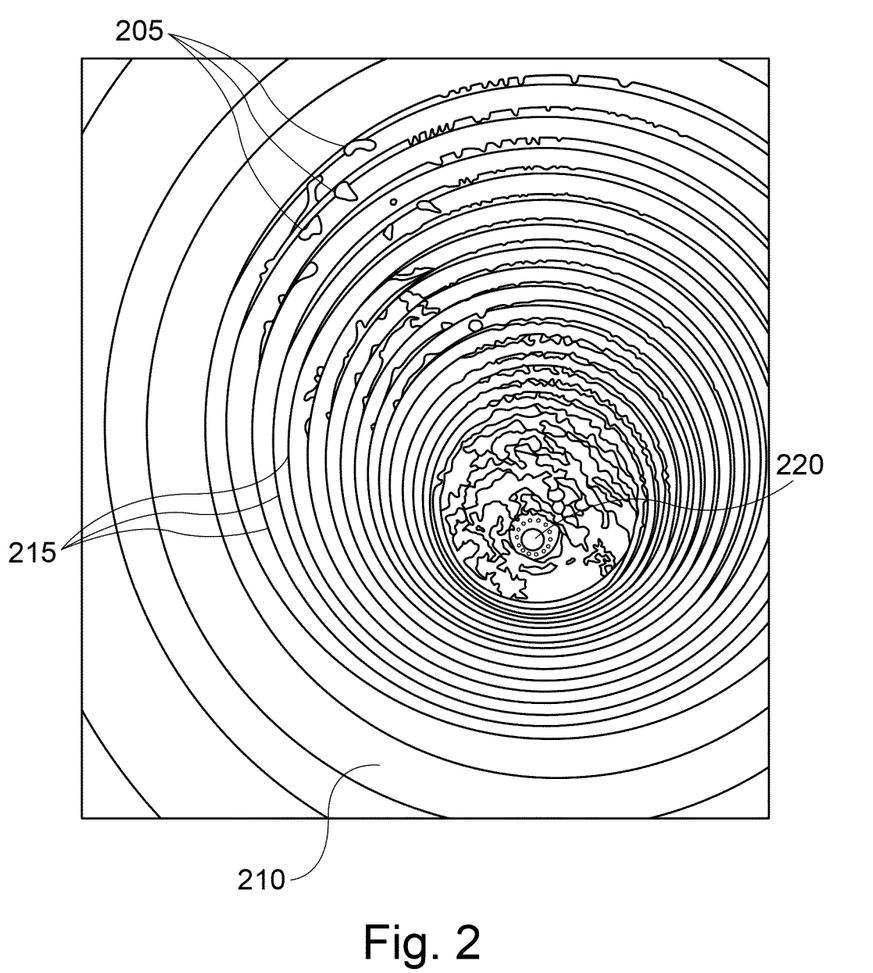
FIG. 2 shows a radiation conduit with deposits of debris and/or vapor.

FIG. 2 shows an example of a radiation conduit 200 with accumulated deposits of tin debris 205 and/or vapor, and is provided for purposes of general background information relating to radiation conduits. The radiation conduit 200 of FIG. 2 does not embody the present invention.

The radiation conduit 200 comprises an inner wall which tapers inwardly from an entrance aperture 210 distal the intermediate focus 6 to an exit aperture 220 proximal the intermediate focus 6. The exit aperture 220 may be the opening 8 in the enclosing structure 9 of the radiation source SO as shown in FIG. 1. The terms 'entrance' and 'exit' are used in reference to a direction of travel of EUV radiation beam B, e.g. the EUV radiation enters the radiation conduit 200 from the plasma formation region 4 and exits the radiation conduit 200 at the intermediate focus 6.

In the example radiation conduit 200 shown in FIG. 2, the radiation conduit 200 is substantially frustoconical, and has a substantially circular cross-section.

A tapering of the inner walls of the radiation conduit 200 may be such that EUV radiation, namely the EUV radiation beam B, which is focused by the collector 5 towards the intermediate focus 6 passes unimpeded through the radiation conduit 200.

The tapering of the radiation conduit 200 may be such that other radiation, particularly radiation which is not focused towards the intermediate focus 6, is incident upon the radiation conduit 200, e.g. a surface of an inner wall of the radiation conduit 200. For example, infrared radiation which is emitted by the laser system 1 and which is not absorbed by the fuel but is instead scattered or reflected from the fuel may be diffracted towards the radiation conduit 200 by the collector 5.

The example radiation conduit 200 of FIG. 2 comprises a plurality of ridges 215. Other example radiation conduits may alternatively or additional comprise smooth surfaces and/or undulating, stepped or vaned surfaces. The plurality of ridges 215 extend circumferentially around the surface of the inner wall of the radiation conduit 200. The ridges 215 are arranged such that when the radiation conduit 200 is viewed along a central axis extending though a center of the entrance aperture 210 and a center of the exit aperture 220, the ridges 215 appear concentrically arranged. In a cross-sectional view of the radiation conduit 200, the ridges 215 may be arranged as a periodic, or a substantially periodic structure.

Each ridge 215 extends from the surface of the inner wall of the radiation conduit 200. The ridges 215 may be configured to absorb incident radiation, e.g. incident infrared radiation. Alternatively, and/or additionally, the ridges 215 may be configured to reflect incident radiation, e.g. incident infrared radiation. For example, the ridges 215 may be configured to reflect incident radiation to a lower portion (i.e. closer to the collector 5) of the radiation conduit 200, wherein the lower portion of the radiation conduit 200 may be configured to absorb the reflected radiation. Such ridges 215 may be known as "glint rings".

In use, a protective gas flow may be introduced into the radiation conduit 200 through the exit aperture 220, or through one or more inlets, nozzles or slits (not shown) generally disposed at or around the intermediate focus 6. The protective gas flow may be introduced by a gas supply system. The gas supply system may be known as a Dynamic Gas Lock (DGL) system.

The DGL system may be configured to direct a gas flow from the intermediate focus region 6 towards the plasma formation region 4. That is, the protective gas flow may be in a direction opposite (e.g. substantially opposite) to a propagation direction of the radiation beam B. The protective gas flow may have a flow rate that is sufficient to reduce or prevent debris and/or vapor from travelling from the plasma formation region 4 towards the intermediate focus 6.

When fuel is illuminated with laser beam 2 to produce the plasma 7 a portion of the fuel may become debris. Debris may include particulate debris, such as for example Sn clusters, Sn particles, Sn microparticles, Sn nanoparticles, and/or Sn deposits, molecular and/or atomic debris, such as for example Sn vapor, SnHx vapor, Sn atoms, Sn ions. The protective gas flow may prevent such debris and/or vapor from entering the illumination system IL. A flow rate of the protective gas flow may be selected depending on a gas used for the protective gas flow, a velocity of the gas used in the protective gas flow, a density or pressure of the gas used in the protective gas flow, a size of debris, e.g. particulate debris, a velocity of debris and/or a direction of debris diffusion in the radiation source SO. Additionally or alternatively, the flow rate of the protective gas flow may be selected depending on the arrangement or geometry of the gas supply system.

A flow rate of the protective gas is generally selected to be adequate to limit an amount of debris particles and/or vapor, e.g. Sn debris particles and/or vapor, passing through the intermediate focus 6, or an intermediate focus region (wherein the term "intermediate focus region" is a term corresponding to, analogous to, or interchangeable with, the term "intermediate focus", thus protecting at least part of the lithographic apparatus from fuel contamination. However, at higher speeds, the protective gas flow may introduce a degree of gas recirculation within the radiation conduit 200. Such recirculation, or 'backflow' may act to bring the debris particles and/or vapor, e.g. Sn debris particles and/or vapor, closer to the intermediate focus 6, such that they can pass into the lithographic apparatus. Furthermore, such recirculation may also bring debris and/or vapor into contact with a surface, e.g. the inner wall, of the radiation conduit 200. Such an effect can be seen in FIG. 2, wherein deposits of tin debris 205 and/or vapor on the ridges 215 on the radiation conduit 200 are clearly visible. Such recirculation may occur, in particular, close to the intermediate focus 6.

Figure 3:
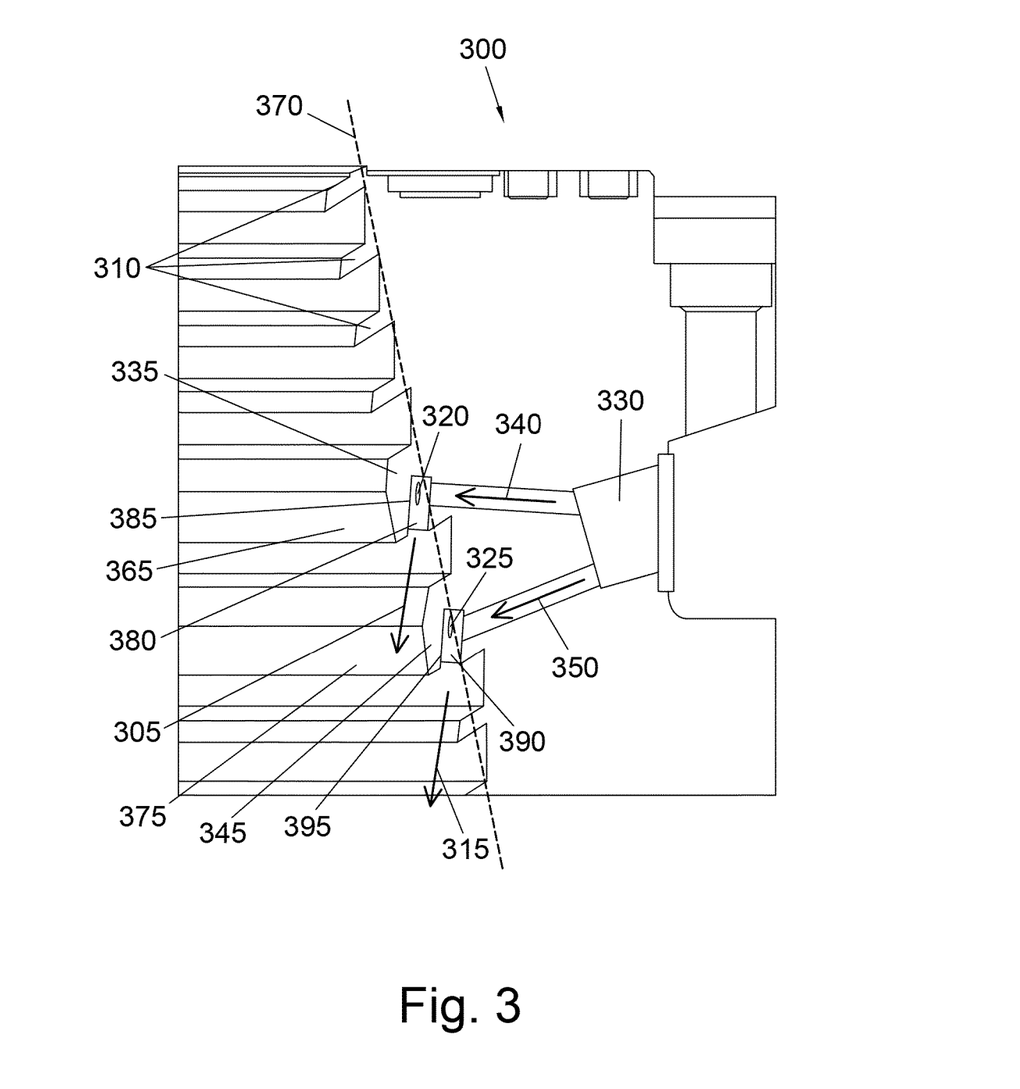
FIG. 3 depicts a cross-section of a perspective view of a portion of a radiation conduit according to an embodiment of the present invention.

FIG. 3 depicts a cross-section of a perspective view of a portion of a radiation conduit 300 according to an embodiment of the present invention. FIG. 3 also provides an example of how a design of the radiation conduit 200 shown in FIG. 2 may be modified to embody the present invention.

The radiation conduit 300 comprises an inner wall which tapers inwardly from an entrance aperture (not shown) distal an intermediate focus region to an exit aperture (not shown) proximal the intermediate focus region. In the example embodiment shown in FIG. 3, the entrance aperture would be disposed towards the bottom of FIG. 3, and the exit aperture would be disposed towards the top of FIG. 3.

The depicted portion of the radiation conduit 300 is a portion of a substantially frustoconical radiation conduit 300, and thus has a substantially circular cross-section. It will be appreciated that, in other embodiments falling within the scope of the invention, the radiation conduit 300 may have some other suitable shape and may have some other suitable cross-sectional shape. For example, the radiation conduit 300 may comprise a substantially cylindrical, spherical, semi-spherical or cuboidal shape. The radiation conduit 300 may comprise a cross-section that is substantially circular, ellipsoidal, square or any other polyhedral shape. The radiation conduit 300 may have a generally hollow frustum shape.

A tapering of the inner wall of radiation conduit 300 may be such that EUV radiation which is focused by the collector 5 towards the intermediate focus 6 passes unimpeded through the radiation conduit 300. As described with reference to radiation conduit 200, the tapering of the radiation conduit 300 may be such that other radiation, particularly radiation which is not focused towards the intermediate focus 6, is incident upon the radiation conduit 300.

The radiation conduit 300 may be disposed proximal the intermediate focus region of the radiation source. That is, the radiation conduit 300 may form an upper portion of a radiation conduit assembly, wherein the upper portion is proximal the intermediate focus region and a lower portion of the radiation conduit assembly is distal the intermediate focus region and/or proximal the plasma formation region. The radiation conduit 300 may correspond to an uppermost portion (e.g. a portion closest to the intermediate focus region) of the radiation conduit assembly. As such, the radiation conduit 300 may be termed an "Intermediate Focus Cap". Such a radiation conduit assembly may comprise one or more medial or lower sections. Such medial or lower sections may be substantially frustum shaped and coupled to the radiation conduit 300 to form a radiation conduit assembly. Furthermore, in one embodiment, one or more medial or lower sections of such a radiation conduit assembly may comprise a vaned or ridged surface, configured to absorb and/or reflect radiation, such as infrared radiation. In yet further embodiments, such a medial or lower section may comprise a temperature-controlled surface, in particular an actively cooled surface. Such cooled surfaces may, for example, act to maintain collected tin in a solid state.

In the example embodiment of FIG. 3, the radiation conduit 300 comprises a plurality of vanes 310. That is, the inner surface of the wall of the radiation conduit 300 is defined by vane surfaces. It will be appreciated that in other embodiments falling within the scope of the invention, the inner surface of the wall of the radiation conduit 300 may be defined by at least one of: a smooth surface; ridged surfaces; a stepped surface; undulating surfaces; and/or vane surfaces.

The radiation conduit 300 comprises a plurality of outlets 320, 325 for directing a protective gas flow. Each outlet 320, 325 may direct a protective gas flow from a source of gas such as a distribution channel 330 into the radiation conduit 300. That is, each outlet 320, 325 may direct a protective gas flow into a conduit, chamber, space or vessel defined by the inner wall of the radiation conduit 300.

The protective gas flow may comprise hydrogen gas. It will be appreciated that in other embodiments another gas or a mixture of gases may be used. For example, in other embodiments, the protective gas flow may comprise argon or helium gas.

The example radiation conduit 300 comprises a plurality of guide portions 335, 345. In the example embodiment of FIG. 3, the radiation conduit 300 comprises two guide portions 335, 345. It will be appreciated that, in other embodiments, the radiation conduit 300 may comprise only one guide portion, or may comprise more than two guide portions, such as three, four, five or more guide portions. In a preferred embodiment, the radiation conduit 300 comprises two guide portions.

Each guide portion 335, 345 extends from the inner surface of the wall of the radiation conduit 300. Each guide portion 335, 345 may extend circumferentially and/or continuously around an inner surface of the wall of the radiation conduit 300.

The guide portions 335, 345 are arranged such that when the radiation conduit 300 is viewed along a central axis extending though a center of the entrance aperture and a center of the exit aperture, the guide portions 335, 345 appear concentrically arranged. In a cross-sectional view of the radiation conduit 200, the guide portions 335, 345 may be arranged as a periodic, or a substantially periodic structure.

Each guide portion 335, 345 forms a substantially ring-shaped structure. The guide portions 335, 345 may be referred to as 'flow-rings'.

Each guide portion 335, 345 is configured to redirect a protective gas flow from an associated outlet 320, 325. For example, a first guide portion 335 is configured to redirect the protective gas flow from a first outlet 320. A second guide portion 345 is configured to redirect the protective gas flow from a second outlet 325.

In a preferred embodiment, a plurality of outlets is associated with each guide portion 335, 345. In one example, 32 outlets may be associated with the first guide portion 335 and 32 outlets may be associated with the second guide portion 345. In other embodiments, fewer than or greater than 32 outlets may be associated with each guide portion. Such outlets may be evenly or unevenly spaced apart, e.g. circumferentially spaced apart.

The plurality of outlets may be disposed circumferentially and/or, peripherally around an interior wall of the radiation conduit 300. The plurality of outlets may be axially arranged around an interior wall of the radiation conduit 300. That is, the plurality of outlets may be arranged to extend around the radiation conduit 300. The plurality of outlets may be evenly, e.g. substantially evenly, spaced apart.

Furthermore, different guide portions may have different amounts of associated outlets. For example, the first guide portion 335 is disposed closer to the intermediate focus 6 than the second guide portion 345. As such, a circumference or perimeter of the first guide portion 335 is less than a circumference or perimeter of the second guide portion 345, due to an inward tapering from the entrance aperture to the exit aperture of the radiation conduit 300. Thus, due to differences in circumferential dimensions of different guide portions, a different amount of outlets may be associated with each guide portion. That is, the first guide portion 335 may have fewer associated outlets 320 than the second guide portion 345, due at least in part to the first guide portion 335 having a smaller circumference or perimeter than the second guide portion 345.

The outlets 320, 325 may be configured to introduce a protective gas into the radiation conduit 300 along an entire perimeter of the inner wall of the radiation conduit 300.

Each outlet may comprise an opening in the surface of the wall of the radiation conduit 300.

In other embodiments, one or more of the outlets may comprise nozzles. Such nozzles may protrude from the surface of the wall of the radiation conduit 300. Nozzles that protrude from the surface of the wall of the radiation conduit may offer a degree of protection from clogging by debris.

The outlets 320, 325 are outlets from the perspective of the source of the protective gas, which outputs gas into a vessel of chamber defined by the wall(s) of the radiation conduit. As such, any 'outlets' may also be considered to be 'inlets' from the perspective of the conduit, vessel, space or chamber defined by the inner wall(s) of the radiation conduit 300.

Each guide portion 335, 345 may comprise a plurality of surfaces. For example, in the embodiment of FIG. 3 a first surface 365, 375 of the at least one guide portion 335, 345 is substantially parallel to the inner surface of the wall of the radiation conduit 300, e.g. substantially parallel to an overall tapering surface generally defined by the surface of the inner wall of the conduit 300, and denoted by dashed line 370 in FIG. 3.

In the example embodiment of FIG. 3, a second surface 385, 395 of the at least one guide portion 335, 345 forms a channel 380, 390 between the inner surface of the wall of the radiation conduit 300 and the at least one the guide portion 335, 345. The outlets 320, 325 on the inner surface of the wall of the radiation conduit 300 are disposed in the channels 380, 390.

Each guide portion 335, 345 is configured to redirect the protective gas flow from a first direction substantially away from the inner surface of the wall of the radiation conduit 300 to a second direction substantially along the inner surface of the wall of the radiation conduit 300. The first direction is denoted by first arrows 340, 350 in FIG. 3. The second direction is denoted by second arrows 305, 315 in FIG. 3. The guide portions are configured to redirect the protective gas flow to form a protective gas curtain flow directed substantially along the inner surface of the wall of the radiation conduit 300. Such a protective gas curtain may flow substantially towards the plasma formation region 4 and/or the collector 5.

As previously described, a region of gas recirculation or 'backflow' may be induced in a radiation source, in particular in close proximity to interior walls of the radiation source, by a flow of protective gas introduced by a DGL system or the like. By introducing a protective gas curtain flow directed substantially along the inner surface of the wall of the radiation conduit in a direction generally towards the collector 5, such a backflow region may be interrupted and/or mitigated or reduced in scale or extent. Thus, a degree of contamination of the radiation conduit 300 and/or lithography apparatus LA may be reduced. Such effects are described in more detail below with reference to FIGS. 4a and 4b.

In an example embodiment, the channels 380, 390 may be angled relative to the inner surface of the wall of the radiation conduit 300 such that the protective gas flow from the outlets 320, 325 is redirected away from any vane surfaces 310 of the radiation conduit 310. Furthermore, a channel 380 associated with a first guide portion 335 may be angled relative to the inner surface of the wall of the radiation conduit 300 such that the protective gas flow in a direction denoted by arrow 305 from outlet 320 associated with the first guide portion 335 is redirected away from the second guide portion 345.

In some embodiments wherein the radiation conduit 300 comprises a vaned surface, a vane 355 immediately adjacent the guide portion 345 may extend from an inner surface of the wall of the radiation conduit 300 to a lesser extent than other vanes 310. That is, in some embodiments, one or more vanes immediately adjacent a guide portion may be configured such that they do not block the protective gas flow in the second direction substantially along the inner surface of the wall of the radiation conduit 300, as denoted by arrows 315 in FIG. 3.

In the embodiment shown in FIG. 3, the guide portion 335, 345 and the radiation conduit 300 are formed as a monolithic structure. In other embodiments, one or more guide portions may be separately formed and affixed, e.g. retrofitted, to the radiation conduit 300.

The radiation conduit 300 may be formed from, or comprise, a material selected to be corrosion resistant, e.g. to be resistant against corrosion by the fuel in the environment in the radiation source SO, e.g. the hydrogen environment in the radiation source SO. The material of the radiation conduit 300 may be selected to be resistant to the thermal variations, such as thermal variations due to the radiation in the radiation source SO and/or the plasma 7. The exemplary radiation conduit 300 may comprise or be made of a metal or metal alloy. For example, the material of radiation conduit 300 may be or comprise molybdenum, tungsten, aluminum, stainless steel, copper or an alloy thereof. The radiation conduit 300 may comprise a metal or metal alloy surface.

Figure 4A:
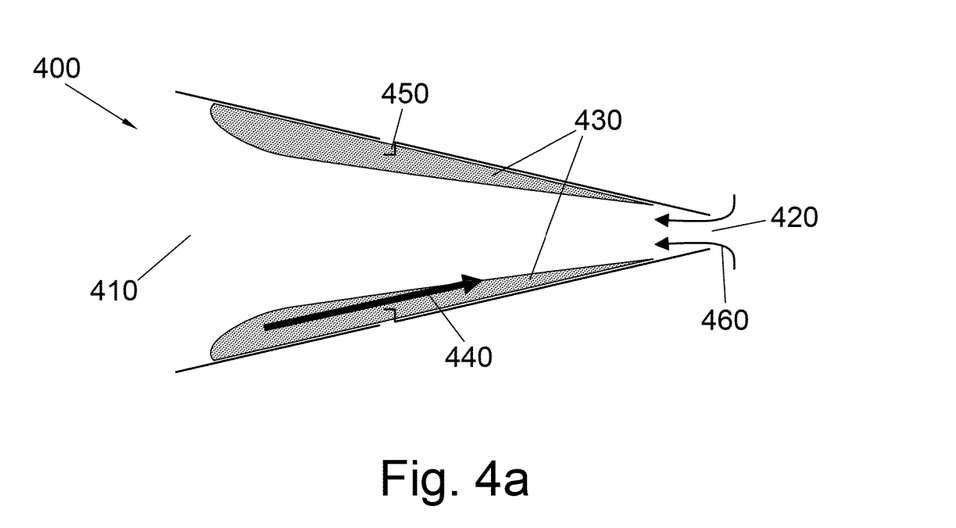
FIG. 4a depicts a region of backflow in a radiation conduit.

FIG. 4a is a schematic diagram depicting a region of gas recirculation, or backflow, in a radiation conduit 400 according to an embodiment of the invention.

The radiation conduit 400 comprises an inner wall which tapers inwardly from an entrance aperture 410 distal an exit aperture 420 proximal the intermediate focus.

For purposes of example, a protective gas flow 460 is shown being introduced into the radiation conduit 400 through the exit aperture 420. In other embodiments, the protective gas may be introduced through one or more inlets, nozzles or slits (not shown) generally disposed at or around the intermediate focus 6 and/or the exit aperture 420. As previously described, the protective gas flow 460 may be introduced by a dynamic gas lock (DGL) system.

For purposes of example only, a single guide portion 450 is shown in FIG. 4a. In the example, no protective gas flow is being redirected by the single guide portion 450.

Furthermore, for purposes of example only, the radiation conduit 400 is shown with no vaned, ridged or undulating surfaces. It will be understood that in other embodiments, at least a portion of an inner surface of the wall of the radiation conduit 400 may be defined by at least one of: a smooth surface; a stepped surface; ridged surfaces; undulating surfaces; and/or vane surfaces.

In the example of FIG. 4a, the protective gas flowing through the exit aperture 420 has introduced a region 430 of gas recirculation within the radiation conduit 400. Such gas recirculation, or 'backflow' may act to bring debris particles and/or vapor, e.g. Sn debris particles and/or vapor, originating in the proximity of the entrance aperture 410 closer to the intermediate focus 6, such that they may pass into the lithographic apparatus LA.

Furthermore, particles of debris and/or vapor, e.g. Sn debris particles and/or vapor, may have a trajectory that is close to and substantially parallel to an inner surface of a wall of the radiation conduit 400, such that suppression of such debris by a protective gas flow from a DGL system or the like is minimal, due at least in part to the recirculation region.

Such gas recirculation may also bring such debris and/or vapor into contact with a surface, e.g. the inner wall, of the radiation conduit 400. A direction of a flow of the recirculated gas is shown in FIG. 4a by arrow 440. Such gas recirculation may occur, in particular, close to the intermediate focus 6 and/or exit aperture 420. Furthermore, such gas recirculation may also draw such debris and/or vapor towards the intermediate focus 6 and/or exit aperture 420, which may result in such debris and/or vapor passing through the intermediate focus 6 and/or exit aperture 420 and entering the lithographic apparatus LA. Such a contamination of the lithographic apparatus LA may, for example, result in a contamination of the patterning device MA within the lithographic apparatus LA. The contamination of the patterning device MA may reduce the imaging performance of the lithographic apparatus LA and may in serious cases require the patterning device MA to be replaced, incurring costs and production inefficiencies.

Figure 4B:
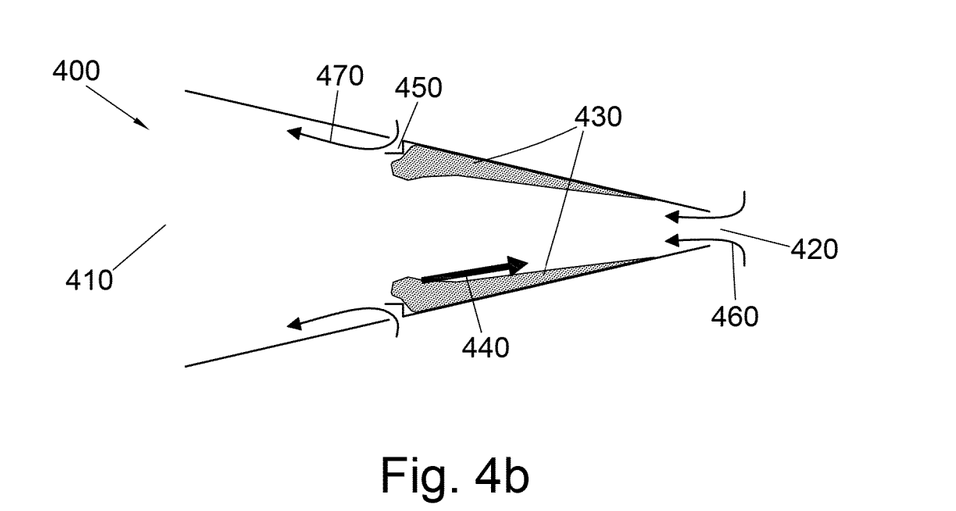
FIG. 4b depicts a region of backflow in a radiation conduit according to an embodiment of the present invention.

FIG. 4b is a schematic diagram depicting a region of gas recirculation or backflow in the radiation conduit 400 according to an embodiment of the invention. FIG. 4b corresponds to FIG. 4a, except a protective gas flow 470 is being redirected by the single guide portion 450.

The single guide portion 450 is configured to redirect the protective gas flow 470 to form a protective gas curtain flow directed substantially along the inner surface of the wall of the radiation conduit 400. In use, the protective gas curtain flow flows substantially towards the plasma formation region and/or collector 5.

It can be seen that, due to the protective gas curtain flow, an extent of the region 430 of gas recirculation within the radiation conduit 400 is significantly reduced. In particular, the region 430 of gas recirculation does not extend substantially towards the entrance aperture of the radiation conduit 400. As such, the region 430 of gas recirculation may not pick up as much debris and/or vapor and transfer such debris and/or vapor towards the exit aperture 420. Furthermore, due at least in part to a reduced extent of the region 430 of gas recirculation within the radiation conduit 400, debris and/or vapor that has a trajectory close to and substantially parallel to an inner surface of a wall of the radiation conduit 400 may be more likely to be suppressed by a protective gas flow from a DGL system or the like.

Figure 5A:
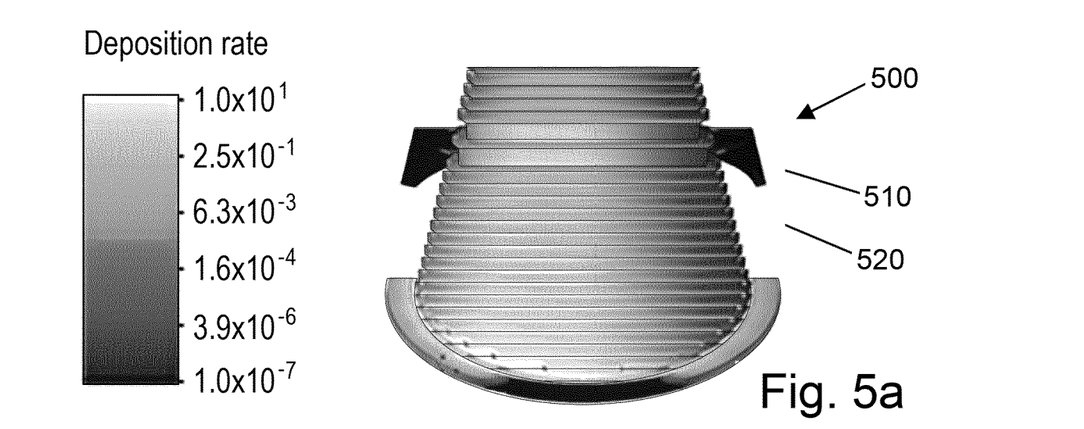
FIG. 5a shows results of a simulation of Sn particles and/or vapor deposition in a radiation conduit according to an embodiment of the present invention, with no protective gas flow.
Figure 5B:
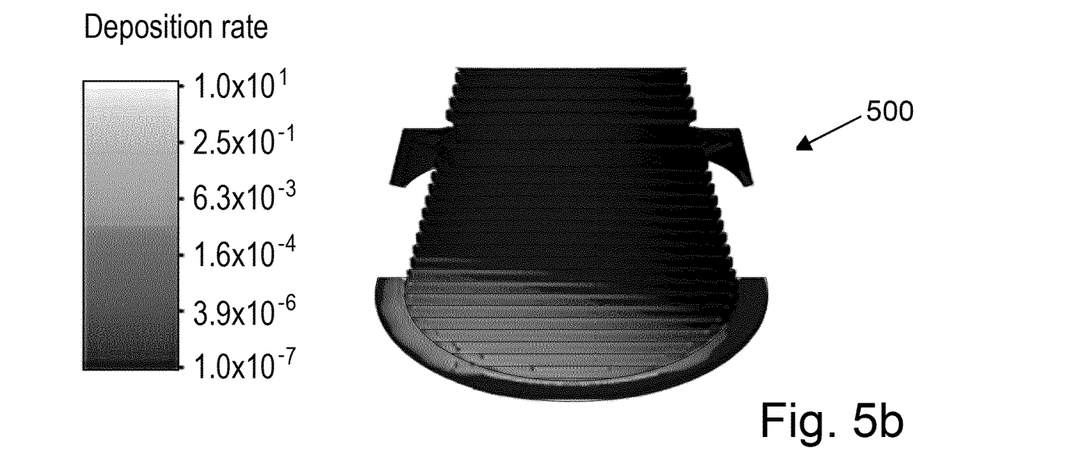
FIG. 5b shows results of a further simulation of Sn particles and/or vapor deposition in a radiation conduit according to an embodiment of the present invention, with a protective gas flow of 20 slm (standard liters per minute)
Figure 5C:
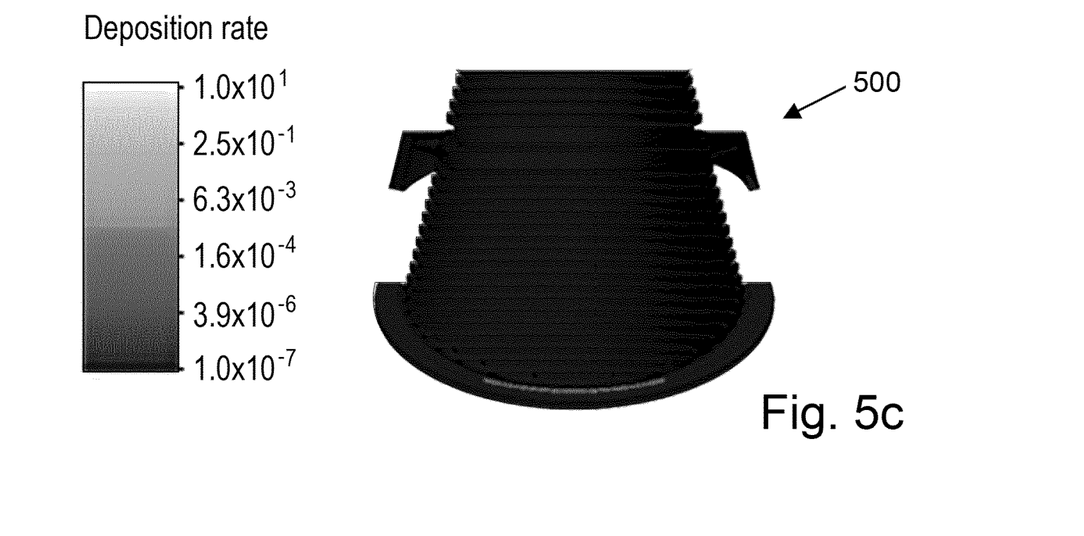
FIG. 5c shows results of a further simulation of Sn particles and/or vapor deposition in a radiation conduit according to an embodiment of the present invention, with a protective gas flow of 40 slm.

The effectiveness of the invention is exemplified in FIGS. 5a to 5c, which depict results of a simulation of Sn particle and/or vapor deposition in a radiation conduit according to an embodiment of the present invention, with various protective gas flow rates.

For example, FIG. 5a depicts a radiation conduit 500 comprising a pair of guide portions 510, 520. In FIG. 5a, no protective gas is redirected by the guide portions to form a curtain flow directed substantially along the inner surface of the wall of the radiation conduit 500. As such, a simulated deposition rate, e.g. a rate of deposition of Sn debris and/or vapor on the radiation conduit 500, is in the region of 10 to 0.25 nanometer per Giga-pulse, e.g. nanometers per Giga-pulse of laser output.

FIG. 5b depicts the radiation conduit 500 with a protective gas redirected by the guide portions to form a curtain flow directed substantially along the inner surface of the wall of the radiation conduit 500. A simulated flow rate of the protective gas is 20 standard liters per minute. As such, a simulated deposition rate, e.g. a rate of deposition of Sn debris and/or vapor on the radiation conduit 500, is in the region of $1.6 \times 10^{-4}$ to $1 \times 10^{-7}$ nanometer per Giga-pulse.

FIG. 5c depicts the radiation conduit 500 with a protective gas redirected by the guide portions to form a curtain flow directed substantially along the inner surface of the wall of the radiation conduit 500. A simulated flow rate of the protective gas is 40 standard liters per minute. As such, a simulated deposition rate, e.g. a rate of deposition of Sn debris and/or vapor on the radiation conduit 500, is in the region of $1 \times 10^{-7}$ nanometer per Giga-pulse over the entire surface of the radiation conduit 500.

The chamber of the radiation source may comprise an exhaust (not shown) to remove gas therefrom. Further the radiation source may comprise other means to remove or collect Sn debris. Such means for example may comprise heating means in conjunction with (Sn) deposition surfaces and a gutter- or guiding system leading to a Sn-bucket to collect the molten tin. The Sn bucket is provided at a lower part of the radiation source.

Thus, it can be seen from the above-described simulation results that that a radiation source embodying the present invention can exhibit a substantially reduced rate of deposition of tin debris and/or vapor on the radiation conduit 500, by increasing a flow rate of a protective gas flow curtain flowing substantially along the inner surface of the wall of the radiation conduit 500. Furthermore, a radiation source embodying the present invention may result in significantly less debris and/or vapor passing through the intermediate focus and entering the lithographic apparatus.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A radiation source for an EUV lithography apparatus, the radiation source comprising:
   a chamber comprising a plasma formation region;
   a radiation collector configured in the chamber and configured to collect radiation emitted at the plasma formation region and to direct the collected radiation towards an intermediate focus region; and
   a radiation conduit disposed between the radiation collector and the intermediate focus region,
   wherein the radiation conduit comprises at least one outlet on an inner surface of a wall of the radiation conduit for directing a protective gas flow, and at least one guide portion extending from the inner surface of the wall of the radiation conduit and configured to redirect the protective gas flow, and
   wherein the radiation source comprises magnets for generating a magnetic field within the chamber, the magnets being configured to trap charged particles radiating from the plasma formation region.

2. The radiation source of claim 1, wherein the at least one guide portion is configured to redirect the protective gas flow from a first direction substantially away from the inner surface of the wall of the radiation conduit to a second direction substantially along the inner surface of the wall of the radiation conduit.

3. The radiation source of claim 2, wherein the second direction is substantially towards the plasma formation region.

4. The radiation source of claim 1, wherein the at least one guide portion is configured to redirect the protective gas flow to form a protective gas curtain flow directed substantially along the inner surface of the wall of the radiation conduit.

5. The radiation source of claim 1, wherein the inner surface of the wall tapers inwardly from an entrance aperture distal to the intermediate focus region to an exit aperture proximal to the intermediate focus region.

6. The radiation source of claim 1, wherein the radiation conduit is disposed proximal to the intermediate focus region.

7. The radiation source of claim 1, wherein the at least one guide portion and the radiation conduit are formed as a monolithic structure.

8. The radiation source of claim 1, wherein the at least one guide portion extends circumferentially and/or continuously around the inner surface of the wall of the radiation conduit.

9. The radiation source of claim 1, wherein a surface of the at least one guide portion forms a channel between the inner surface of the wall of the radiation conduit and the at least one guide portion.

10. The radiation source of claim 9, wherein the at least one outlet on the inner surface of the wall of the radiation conduit is disposed in the channel.

11. The radiation source of claim 1, wherein the inner surface of the wall of the radiation conduit is defined by at least one of: a smooth surface; ridged surfaces; a stepped surface; undulating surfaces; and/or vane surfaces.

12. The radiation source of claim 9, wherein the channel is angled relative to the inner surface of the wall such that the protective gas flow is redirected away from a ridge, undulation, or vane of the radiation conduit.

13. A radiation conduit for the radiation source of claim 1, the radiation conduit comprising:
   at least one outlet on an inner surface of a wall of the radiation conduit for directing a protective gas flow; and
   at least one guide portion extending from the inner surface of the wall of the radiation conduit and configured to redirect the protective gas flow.

14. A method of reducing debris and/or vapor deposition in the radiation conduit of claim 13, the method comprising providing a protective gas flow to the at least one outlet of the radiation conduit, such that the protective gas flow is redirected by the at least one guide portion.

* * * * *